United States Patent
Wang et al.

(10) Patent No.: US 11,226,648 B2
(45) Date of Patent: Jan. 18, 2022

(54) POWER FACTOR CORRECTION CIRCUIT, CONTROL METHOD AND CONTROLLER

(71) Applicant: Silergy Semiconductor Technology (Hangzhou) LTD, Hangzhou (CN)

(72) Inventors: Zhaofeng Wang, Hangzhou (CN); Xiaodong Huang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/882,614

(22) Filed: May 25, 2020

(65) Prior Publication Data

US 2020/0379496 A1 Dec. 3, 2020

(30) Foreign Application Priority Data

May 31, 2019 (CN) .......................... 201910471007.4

(51) Int. Cl.
*G05F 1/70* (2006.01)
*G01R 21/00* (2006.01)
*H02M 1/12* (2006.01)
*H02M 1/42* (2007.01)

(52) U.S. Cl.
CPC .............. *G05F 1/70* (2013.01); *G01R 21/006* (2013.01); *H02M 1/12* (2013.01); *H02M 1/4208* (2013.01)

(58) Field of Classification Search
CPC .......... G05F 1/10; G01R 21/006; H02M 1/12; H02M 1/4208
See application file for complete search history.

(56) References Cited

U.S. PATENT DOCUMENTS

| | | | |
|---|---|---|---|
| 6,756,771 B1 | 6/2004 | Ball et al. | |
| 7,123,494 B2 | 10/2006 | Turchi | |
| 7,313,007 B2 | 12/2007 | Wu et al. | |
| 8,674,544 B2 | 3/2014 | Rada et al. | |
| 8,736,236 B2 | 5/2014 | Sun et al. | |
| 9,246,381 B2 | 1/2016 | Xu | |
| 9,692,294 B2 | 6/2017 | Jiang et al. | |
| 10,193,439 B2 | 1/2019 | Wang et al. | |
| 10,396,655 B2 | 8/2019 | Zhao et al. | |
| 2006/0119337 A1 | 6/2006 | Takahashi et al. | |
| 2010/0246226 A1 | 9/2010 | Ku et al. | |
| 2011/0221402 A1 | 9/2011 | Park et al. | |
| 2013/0043847 A1 | 2/2013 | Kim | |
| 2014/0063873 A1* | 3/2014 | Acker | H02M 1/12 363/40 |
| 2014/0160815 A1 | 6/2014 | Jeong et al. | |
| 2015/0023067 A1 | 1/2015 | Terasawa | |
| 2016/0065054 A1 | 3/2016 | Li et al. | |
| 2016/0190912 A1 | 6/2016 | Lim et al. | |
| 2017/0181234 A1 | 6/2017 | Huang et al. | |

(Continued)

*Primary Examiner* — Kyle J Moody
*Assistant Examiner* — Lakaisha Jackson

(57) ABSTRACT

A power factor correction circuit includes a power meter configured to measure a total harmonic distortion (THD) at an input port; a switching-type regulator that is controllable by a switch control signal in order to adjust a power factor; and a controller configured to generate the switch control signal to control the switching-type regulator to perform power factor correction, where the controller adjusts an on-time of a main switch of the switching-type regulator based on the measured THD to decrease the THD.

16 Claims, 14 Drawing Sheets

(56) References Cited

U.S. PATENT DOCUMENTS

| | | |
|---|---|---|
| 2017/0250620 A1 | 8/2017 | White et al. |
| 2018/0269779 A1* | 9/2018 | Wang ...................... H02M 1/12 |
| 2019/0252881 A1* | 8/2019 | Kono ...................... H02M 7/48 |

* cited by examiner

POWER FACTOR CORRECTION CIRCUIT, CONTROL METHOD AND CONTROLLER

RELATED APPLICATIONS

This application claims the benefit of Chinese Patent Application No. 201910471007.4, filed on May 31, 2019, which is incorporated herein by reference in its entirety.

FIELD OF THE INVENTION

The present invention generally relates to the field of power electronics, and more particularly to power factor correction circuits, control methods, and controllers.

BACKGROUND

A power factor (PF) is expressed by a cosine function of a phase difference between a voltage and a current. The power factor may also be expressed by a ratio of an active power to an apparent power. The power factor may be used for characterizing an electrical efficiency of an electrical device, whereby a low power factor represents a low electrical efficiency. A phase difference between a voltage and a current may be eliminated or reduced by performing a power factor correction (PFC) operation, in order to improve a power factor of a system, such that a transmission efficiency of active power is increased, and a grid environment is improved.

DETAILED DESCRIPTION

Figure 1:
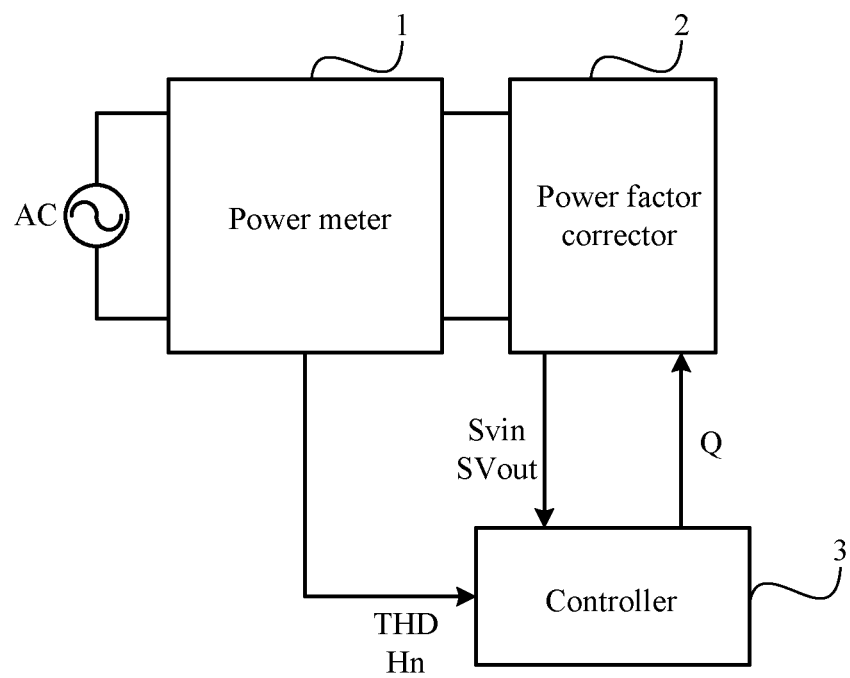
FIG. 1 is a schematic block diagram of an example power factor correction circuit, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In an active power factor correction (PFC) circuit, a fast adjustment may generally be performed on an input current in a closed-loop control manner, such that the input current of the PFC circuit can track a sine alternating-current input voltage in real time, thereby performing power factor correction. A high demand on the power factor correction regarding a total harmonic distortion (THD) has been imposed by current applications. In addition to a demand on the total harmonic distortion in an overloading condition, a demand on the total harmonic distortion in a half-loading condition and even a light-loading condition can also exist imposed, which has approximately the same specification as that in the overloading condition. In one solution for reducing the total harmonic distortion, a theoretical analysis is generally performed on factors affecting a total harmonic distortion indicator, in order to provide a compensation control strategy based on an established model. However, this solution may only be applicable under specific conditions.

Harmonic distortion indicates that an output signal includes additional harmonic components as compared with an input signal, resulting from a nonlinear element in a system. THD is defined as a square root of a square sum of a ratio of an effective value Gn of each harmonic component to an effective value G1 of a fundamental component within a certain order H, that is as shown below in formula (1).

$$THD = \sqrt{\sum_{n=j}^{H} \left(\frac{G_2}{G_1}\right)^2} \quad (1)$$

When the THD of a device is too high, wave distortion may be caused to a voltage and a current in a power network, which can affect a normal operation of other devices in the power network. A nonlinear element in an active PFC circuit can cause high-order harmonic components in an input current. In order to avoid the influence of high-order harmonic components in the power network, reduction of the THD may be needed.

Referring now to FIG. 1, shown is a schematic block diagram of an example power factor correction circuit, in accordance with embodiments of the present invention. In this particular example, the power factor correction circuit can include power meter 1, power factor corrector 2, and controller 3. Power meter 1 and power factor corrector 2 may form a power stage circuit of the power factor correction circuit.

Figure 2:
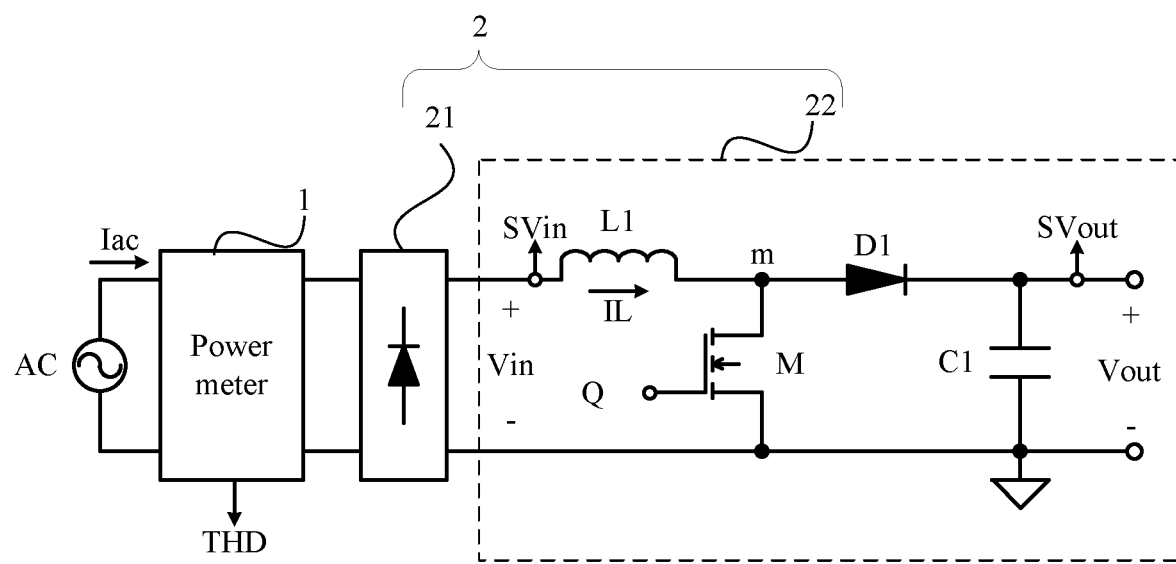
FIG. 2 is a schematic block diagram of an example power stage circuit of an example power factor correction circuit, in accordance with embodiments of the present invention.

Referring now to FIG. 2, shown is a schematic block diagram of an example power stage circuit of an example power factor correction circuit, in accordance with embodiments of the present invention. In this particular example, power factor corrector 2 may include rectifier circuit 21 and switching-type regulator 22. Rectifier circuit 21 can convert an alternating current Iac input from an input source AC into a direct current. Rectifier circuit 21 can be implemented by any suitable rectifier circuitry, such as a half bridge rectifier circuit or a full bridge rectifier circuit. Switching-type regulator 22 can perform power factor correction under control of a switch control signal Q. In this example, a switching-type regulator 22 having a boost topology (BOOST) is shown, but switching-type regulator 22 may have other topologies (e.g., a buck topology (BUCK), a buck-boost topology (BUCK-BOOST), a flyback topology (FLYBACK), etc.). Switching-type regulator 22 can include inductor L1 for storing energy, switch M, diode D1, and capacitor C1. Inductor L1 can connect between an input port and an middle terminal m. Switch M can connect between middle terminal m and a ground terminal. Diode D1 can connect between the middle terminal m and an output terminal and can rectify an inductor current. Capacitor C1 can connect between the output terminal and the ground terminal, and may filter an output voltage. Switch M can be turned on or off under the control of switch control signal Q, thereby controlling inductor current, in order to correct a power factor actively.

In particular embodiments, the on-time of the main switch of switching-type regulator 22 can be adjusted. For example, at least one predetermined harmonic component can inversely be superimposed in the input current of switching-type regulator 22, thus compensating the harmonic component in the input current and minimizing the THD. For example, at least one predetermined harmonic component can inversely be superimposed on a control signal for adjusting the on-time of the main switch of switching-type regulator 22, in order to minimize the THD.

The power stage circuits can also include multiple sampling circuits, to sample input voltage Vin and output voltage Vout of switching-type regulator 22, and output an input voltage sampling signal SVin and output voltage sampling signal SVout. Under some circumstances, only output voltage Vout may be sampled to generate output voltage sampling signal SVout. Input voltage sampling signal SVin and output voltage sampling signal SVout can be fed back to controller 3, and/or output voltage sampling signal SVout may be fed back to controller 3, for generating switch control signal Q. For example, switch control signal Q may characterize the on-time and off-time of the main switch of switching-type regulator 22. Further, power meter 1 can connect to an input port of power factor corrector 2 for measuring the THD of a signal at the input port. Moreover, the measured THD may also be fed back to controller 3 for generating switching control signal Q. In some examples, power meter 1 can measure an amplitude ratio Hn of the harmonic component of the signal at the input port, and the measured amplitude ratio Hn of the harmonic component may also be fed back to controller 3, for generating switch control signal Q.

Controller 3 can generate switch control signal Q based on input voltage sampling signal SVin and output voltage sampling signal SVout (e.g., only output voltage sampling signal SVout in some cases), as well as the measured total harmonic distortion THD (e.g., including the amplitude ratio Hn of each harmonic component in some cases), to control sinusoidal signal switching-type regulator 22. Controller 3 can adjust the on-time of the main switch of the switching-type regulator 22 based on the measured THD (e.g., including amplitude ratio Hn of each harmonic component in some cases) to minimize the THD while performing power factor correction. In one example, controller 3 may perform a control strategy in a digital manner to generate switch control signal Q. That is, controller 3 can lead the measured total harmonic distortion THD into a control loop, in order to generate switch control signal Q in a closed-loop control manner for minimizing the THD. Therefore, the on-time of the main switch of the switching-type regulator 22 may be adjusted based on the measured THD, to realize the harmonic compensating for each harmonic component in the input signals, in order to minimize THD while performing power factor correction. Therefore, the THD can be reduced without performing compensation design, e.g., for a category of factors affecting THD indicators, thereby simplifying the control method.

As described above, harmonic distortion can indicate that the output signal includes additional harmonic components as compared with the input signal due to a nonlinear element in a system. Since an alternating current input to a power stage circuit of a power factor correction circuit is a periodic signal, the periodic signal can be analyzed as a superposition of a direct-current signal and sinusoidal signals with different frequencies by Fourier analysis. Here, each harmonic component is a sinusoidal signal and the frequency of the harmonic component is multiple times that of the sinusoidal signal. Therefore, at least one predetermined harmonic component with the same effective value and an opposite phase compared against each harmonic component of the periodic signal can be superimposed (that is, opposite superposition) on the periodic signal to counteract each harmonic component, thereby reducing the THD. Further, the input current of switching-type regulator 22 can be substantially identical to the input alternating current signal; that is, Iin=Iac. Therefore, the predetermined harmonic component may be superimposed on input current Iin of switching-type regulator 22 by adjusting the on-time of the main switch of switching-type regulator 22 such that the unnecessary harmonic component is counteracted and the adjustment of input current Iin is realized. In this way, the THD is decreased or minimized.

In particular embodiments, even harmonic components (e.g., a second harmonic component, a fourth harmonic component and the like) may be counteracted during rectification due to symmetrical phases. Therefore, it may only be required to perform opposite superimposition on odd harmonic components, in order to greatly reduce the total harmonic distortion. However, it should be understood that opposite superimposition may be performed on both the even harmonic components and the odd harmonic components, in order to reduce the THD even more accurately. However, this may cause an increased computational complexity.

In particular embodiments, the predetermined harmonic components can be set by a system designer. For example, controller 3 can be configured to compensate only on a third harmonic component of the input signal. When the input signal also includes a fifth harmonic component or a seventh harmonic component, compensation may be not performed on the fifth harmonic component and the seventh harmonic component of the input signal. In that case, the system may have a low complexity and a fast reaction speed. For example, controller 3 may further be configured to perform compensation on a third harmonic component, a fifth harmonic component, a seventh harmonic component, a ninth harmonic component of the input signal, and so on when the input signal only includes a fifth harmonic component and a seventh harmonic component, based on amplitude ratio Hn of each harmonic component of the input signal measured by power meter 1, amplitude ratios of predetermined third harmonic component and ninth harmonic component can be set to be zero. Thus, multiple harmonic components of the input signal have compensation performed thereon. When the input current of the power factor correction circuit includes only the fundamental component, the input current Iin of the power factor correction circuit only including the fundamental component may be expressed as below in formula (2).

$$I_{in} = \frac{V_{in} * T_{on}}{2L} = \frac{V_m * \sin(\omega t) + T_{on}}{2L} \quad (2)$$

Here, Vm, L and Ton represent an amplitude ratio of the fundamental component, an inductance parameter, and the on-time of the main switch of the switching-type regulator 22 in a constant on-time mode, respectively. However, due to the non-linear element in the circuit, the input current of the power factor correction circuit can also include harmonic components in addition to the fundamental component. Therefore, the harmonic component having a phase opposite to that of the harmonic component in the input current may be superimposed on the input current. When sampling the input voltage, input current Iin$_{new1}$ satisfies the following formula (3) after performing a THD compensation.

$$I_{in_{new1}} = \frac{V_{in} + V_m * (A\sin(3\omega t) + B\sin(5\omega t) + C\sin(7\omega t) + D\sin(9\omega t) + \ldots\ ) * T_{on}}{2L}$$

$$= \frac{V_{in} * (V_{in} + V_m * (A\sin(3\omega t) + B\sin(5\omega t) + C\sin(7\omega t) + D\sin(9\omega t) + \ldots\ ))}{2L * V_{in}} * T_{on}$$

$$= \frac{V_{in} * T_{on}}{2L} * \frac{V_{in} + V_m^*(A\sin(3\omega t) + B\sin(5\omega t) + C\sin(7\omega t) + D\sin(9\omega t) + \ldots\ )}{V_{in}} \quad (3)$$

In the formula above, A, B, C, and D are ratios of amplitudes of harmonic component to amplitudes of the fundamental component (e.g., amplitude ratios). Moreover, the constant above varies from −1 to 1 and on-time T$_{on-new1}$ of the main switch of the switching-type regulator 22 after performing a THD compensation is expressed below as formula (4).

$$T_{on\_new1} = T_{on} + \frac{V_{in} + V_m^*(A\sin(3\omega t) + B\sin(5\omega t) + C\sin(7\omega t) + D\sin(9\omega t) + \ldots\ )}{V_{in}} \quad (4)$$

When the input voltage is not sampled, and the input voltage is an ideally sinusoidal voltage, that is, the input voltage is Vm*sin(wt), input current Iin$_{new2}$ may satisfy the following formula (5) after performing a THD compensation.

$$I_{in_{new1}} = \frac{V_m + (\sin(\omega t) * A\sin(3\omega t) + B\sin(5\omega t) + C\sin(7\omega t) + D\sin(9\omega t) + \ldots\ ) * T_{on}}{2L}$$

$$= \frac{V_m * \sin(\omega t) * T_{on}}{2L} * \frac{\sin(\omega t) + A\sin(3\omega t) + B\sin(5\omega t) + C\sin(7\omega t) + D\sin(9\omega t) + \ldots}{\sin(\omega t)}$$

$$= \frac{V_{in} * T_{on}}{2L} * \frac{\sin(\omega t) + A\sin(3\omega t) + B\sin(5\omega t) + C\sin(7\omega t) + D\sin(9\omega t) + \ldots}{\sin(\omega t)} \quad (5)$$

In the formula above, A, B, C, and D are ratios of amplitudes of harmonic component to amplitudes of the fundamental component (e.g., amplitude ratios). Moreover, the constant above varies from −1 to 1 and on-time T$_{on-new2}$ of the main switch of the switching-type regulator 22 after performing a THD compensation can be expressed as below in formula (6).

$$T_{on\_new2} = T_{on} * \frac{\sin(\omega t) + A\sin(3\omega t) + B\sin(5\omega t) + C\sin(7\omega t) + D\sin(9\omega t) + \ldots}{\sin(\omega t)} \quad (6)$$

According to the formulas above, based on the constant on-time mode (e.g., the on-time of the main switch of the switching-type regulator 22 remains the same in a steady state), at least one predetermined harmonic component can be inversely superimposed on a control signal for controlling the on-time of the main switch of switching-type regulator 22, in order to adjust the on-time. Thus, at least one predetermined harmonic component can be inversely superimposed on input current Iin of switching-type regulator 22. In such a case, the unnecessary harmonic components in input current Iin of switching-type regulator 22 can be counteracted by performing compensation on the harmonic component in the input alternating current signal. In this way, the THD is decreased or minimized.

Based on T$_{on-new1}$ and T$_{on-new2}$ mentioned above, the amplitude ratio of each harmonic component in the input alternating current signal can be determined in order to adjust the on-time of the main switch. Therefore, the measured THD can be led into the control loop to determine the amplitude ratio of each harmonic component. In particular embodiments, controller 3 can adjust the amplitude ratio of each harmonic component based on the measured THD, in order to minimize the THD. For example, a phase of each harmonic component can be considered as identical to that of the fundamental component. However, in some cases, the phase of each harmonic component can be greatly different from that of the fundamental component. Therefore, in addition to determining the amplitude ratio of each harmonic component, the phase of each harmonic component may also be determined.

Therefore, the measured amplitude ratio Hn of each harmonic component and the THD can be introduced to the control loop to assist in determining the phase of each harmonic component. For example, controller 3 can adjust the phase of each harmonic component based on the measured THD and the amplitude ratio of the harmonic component, in order to minimize the THD. As such, two methods for adjusting the on-time of the main switch of the switching-type regulator 22 are provided herein. In one method of particular embodiments, the amplitude ratio of each harmonic component can be adjusted based on the measured THD to minimize the THD. In the other method of particular embodiments, the phase of each harmonic component can be adjusted based on the measured THD and the amplitude ratio Hn of each harmonic component, to minimize THD.

Figure 3:
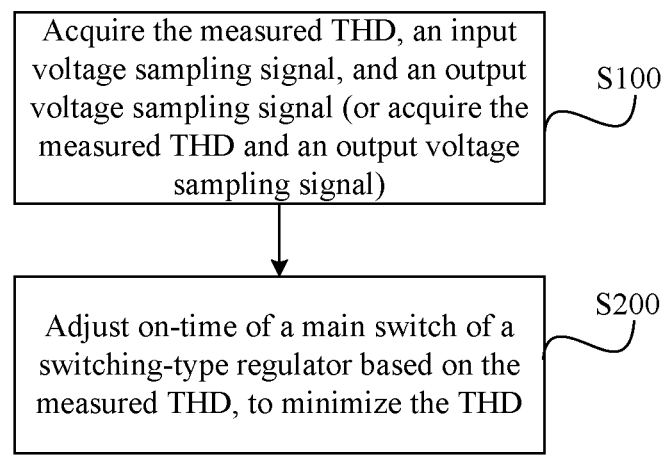
FIG. 3 is a flow diagram of an example control method, in accordance with embodiments of the present invention.

Referring now to FIG. 3, shown is a flow diagram of an example control method, in accordance with embodiments of the present invention. In this particular example, the amplitude ratio of each harmonic component is adjusted based on the measured THD to minimize the THD. In S100, the measured total harmonic distortion THD, input voltage sampling signal SVin, and output voltage sampling signal SVout can be acquired. Optionally, only the measured total harmonic distortion THD and output voltage sampling signal SVout may be acquired in some cases. In S200, the on-time of the main switch of the switching-type regulator can be adjusted based on the total harmonic distortion THD, in order to minimize the total harmonic distortion THD. Further, in S200, power factor correction may also be performed based on input voltage sampling signal SVin and output voltage sampling signal SVout, and/or based on output voltage sampling signal SVout in other control loops.

Figure 4:
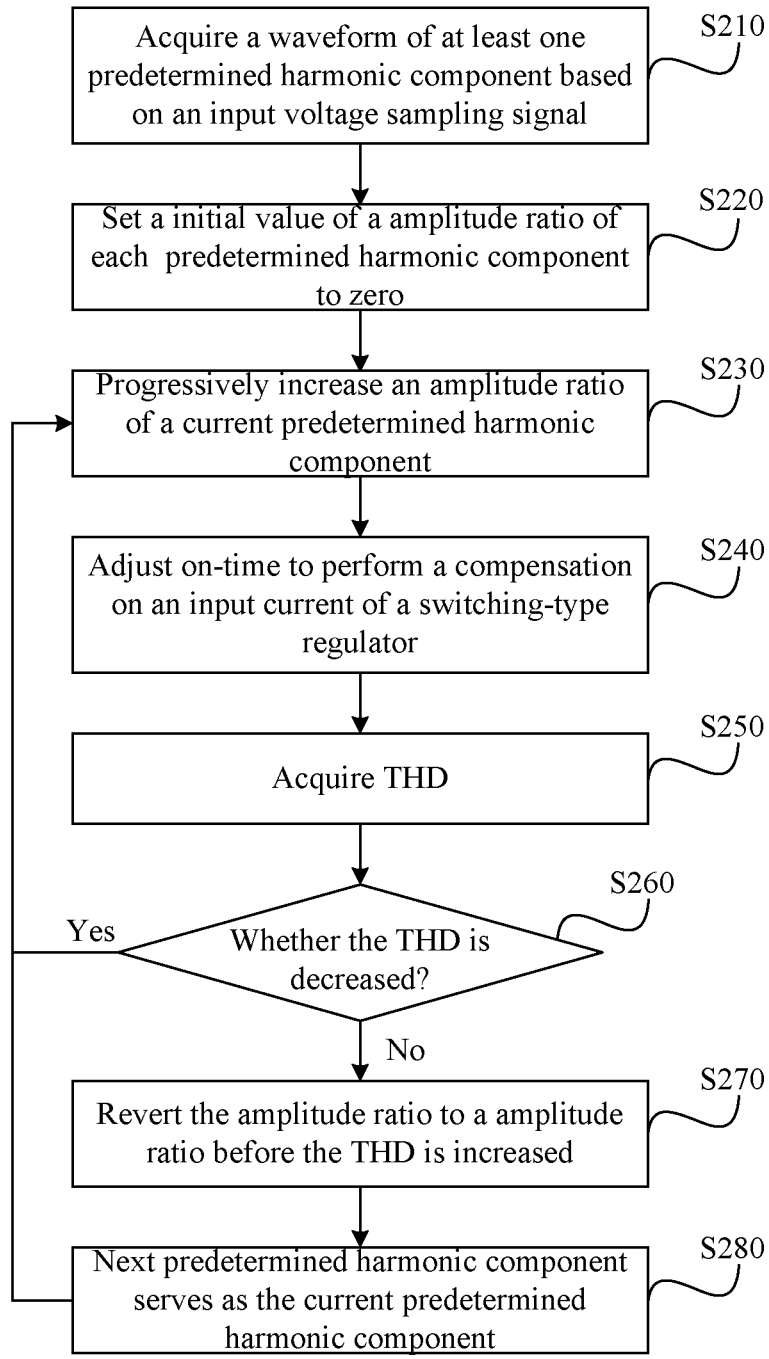
FIG. 4 is a flow diagram of an example control method for adjusting amplitude ratios of harmonic components, in accordance with embodiments of the present invention.

Referring now to FIG. 4, shown is a flow diagram of an example control method for adjusting amplitude ratios of harmonic components, in accordance with embodiments of the present invention. For example, the total harmonic distortion THD may be minimized by performing the following S210 to S280, shown in FIG. 4. In S210, at least one predetermined harmonic component can be acquired based on the input voltage sampling signal. Since there may be multiple harmonic components in an input voltage, compensation may generally be performed on only one or more harmonic components with a frequency close to a fundamental frequency. The at least one predetermined harmonic components can be ranked in advance, and an amplitude ratio of each predetermined harmonic component can be set in order. In S220, initial values of amplitude ratios of the one or more each predetermined harmonic component can be set to be zero. In S230, the amplitude ratio of the predetermined harmonic component can be progressively increased. The amplitude ratio of the predetermined harmonic component may be increased with a predetermined step length, or with changed increased amplitude, which can be calculated for every operation. In S240, the on-time may be adjusted to perform a compensation on the input current of the switching-type regulator.

For example, a predetermined harmonic component can be acquired. Then, the predetermined harmonic component can be multiplied by an amplitude ratio corresponding to the predetermined harmonic component to obtain a multiplied signal, and the multiplied signal can be superimposed on the control signal of the on-time of the main switch of the switching-type regulator. In S250, after adjusting the on-time, a new THD can be measured and acquired. In S260, whether the THD has decreased after the on-time was adjusted can be. If the THD has decreased, the process may proceed to S230, in order to progressively increase the amplitude ratio of the predetermined harmonic component. If the THD has not decreased, this can indicate that the amplitude ratio of the predetermined harmonic component before being increased approaches actual amplitude ratio of the current harmonic component the most. Then, the process may proceed to S270. In S270, the amplitude ratio of the current predetermined harmonic component can revert to the amplitude ratio before the THD increased.

In addition, the predetermined harmonic component having the amplitude ratio before the THD was increased can be superimposed on the control signal of the on-time of the main switch. In S280, a next predetermined harmonic component may serve as the current predetermined harmonic component. The control method can return to S230 to adjust the amplitude ratio of the next harmonic component. As described above, the amplitude ratio of each predetermined harmonic component which approaches the actual the amplitude ratio most can be obtained in an one-by-one manner. Thus, the THD of the system may be reduced during the whole operation. It is to be noted that, the adjusting of the amplitude ratio of each predetermined harmonic component can be maintained during operation of a system, such that the THD of the system is reduced during the whole operation.

Figure 5:
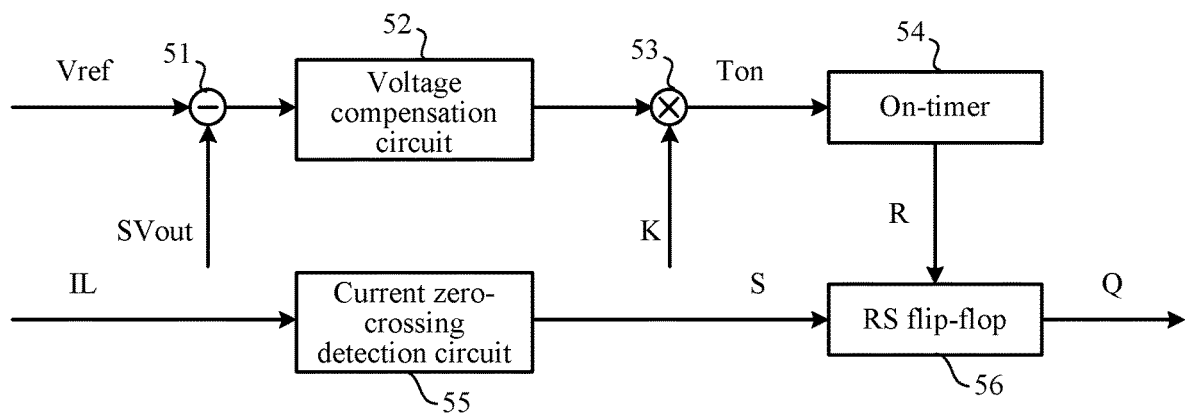
FIG. 5 is a diagram of an example data flow of a controller.

Referring now to FIG. 5, shown is a diagram of an example data flow of a controller. In this example, the controller controls the on-time of the main switch of the switching-type regulator in a closed-loop control manner in a constant on-time mode. That is, in a steady state, the on-time Ton is constant in this example. Subtractor 51 can acquire a difference between output voltage sampling signal SVout and voltage reference signal Vref, and then voltage compensation circuit 52 can output compensation signal Vcmp. Compensation signal Vcmp may be multiplied by a proportionality coefficient K by multiplier 53. The product signal outputted from multiplier 53 can characterize the on-time Ton of the main switch, controlling on-timer 54 to time. After on-timer 54 finishes the timing, RS flip-flop 56 can be reset. Current zero-crossing detection circuit 55 may perform zero-crossing detection on the inductor current. When it is detected that the inductor current crosses zero, RS flip-flop 56 can be set. Then, RS flip-flop 56 can activate switch control signal Q. however, this approach may lack a universal mechanism to compensate a THD of a circuit.

Figure 6:
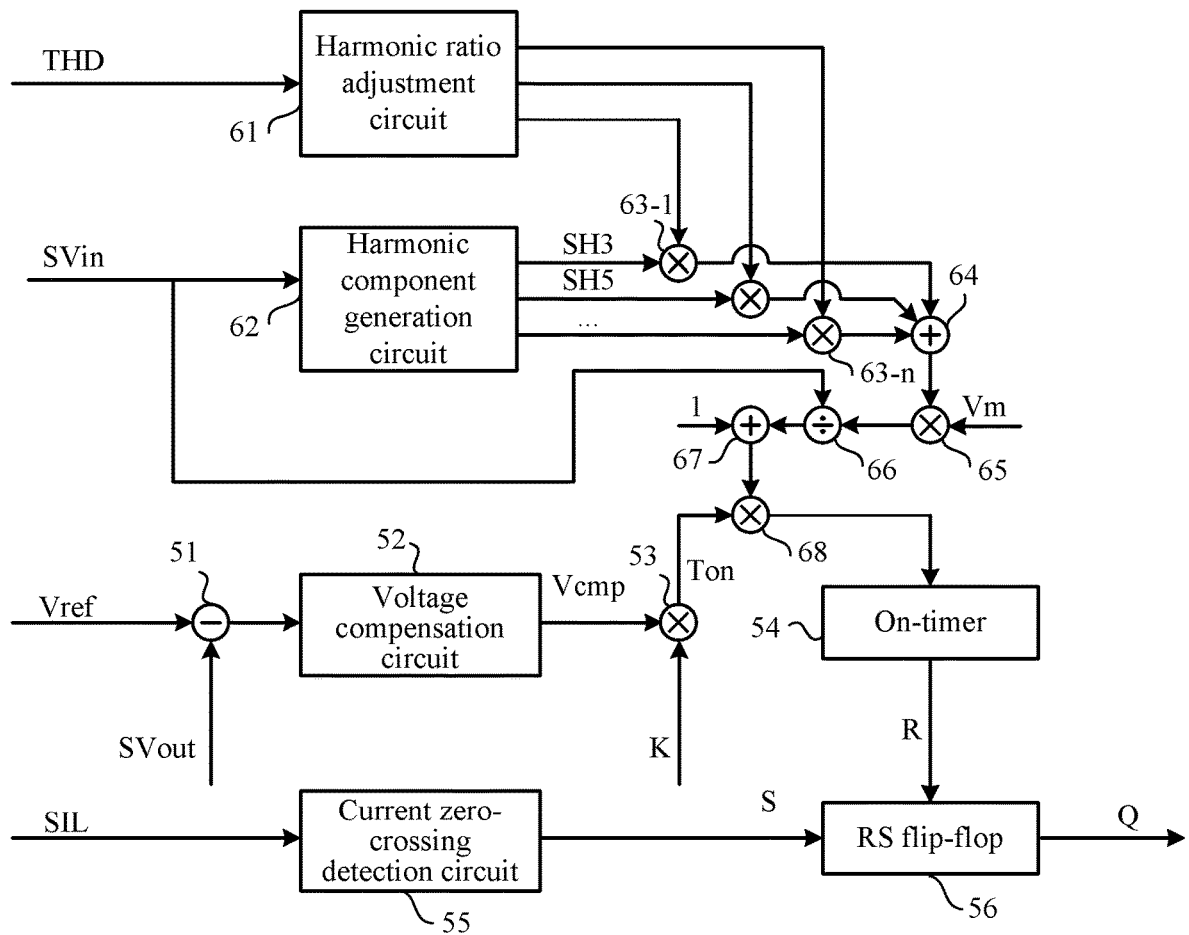
FIG. 6 is a diagram of a first example data flow of the controller adjusting amplitude ratios of harmonic components, in accordance with embodiments of the present invention.

Referring now to FIG. 6, shown is a diagram of a first example data flow of the controller adjusting amplitude ratios of harmonic components, in accordance with embodiments of the present invention. In this particular example, the input voltage signal can be sampled, and at least one predetermined harmonic component can be inversely superimposed on the control signal for controlling the on-time of the main switch of the switching-type regulator. That is, the on-time is adjusted by $T_{on\text{-}new1}$. In this example, based on the control method of FIG. 5, the on-time Ton in the constant on-time mode may further be adjusted to decrease the THD. In addition to subtractor 51, voltage compensation circuit 52, multiplier 53, on-timer 54, current zero-crossing detection circuit 55, and RS flip-flop 56, the controller can also include harmonic ratio adjustment circuit 61, harmonic component generation circuit 62, multipliers 63-1 to 63-$n$, adder 64, multiplier 65, divider 66, adder 67, and multiplier 68. In such a case, subtractor 51 can acquire the difference between output voltage sampling signal SVout and voltage reference signal Vref, and then output the difference to voltage compensation circuit 52.

Further, voltage compensation circuit 52 can output compensation signal Vcmp. Further, harmonic component generation circuit 62 can generate each predetermined harmonic component based on input voltage sampling signal SVin, such as third harmonic SH3, fifth harmonic SH5, and the like. Harmonic ratio adjustment circuit 61 can output the amplitude ratio of each predetermined harmonic component based on the measured total harmonic distortion THD, and may adjust the amplitude ratio to minimize the THD. Amplitude ratios output from harmonic ratio adjustment circuit 61 can be multiplied by corresponding predetermined harmonic components in multipliers 63-1 to 63-*n*, respectively, in order to generate at least one voltage harmonic component. All voltage harmonic components can be superimposed in adder 64** to obtain an output parameter SVin', which can satisfy the following formula (7) below.

$$SVin' = SH3*Ratio3 + SH5*Ratio5 + \ldots \quad (7)$$

In the formula above, Ratioi represents an amplitude ratio of an i-th predetermined harmonic component which is generated and adjusted by harmonic ratio adjustment circuit 61. Input signal SVin' can be multiplied by amplitude Vm of the fundamental component in multiplier 65. The product can be divided by input voltage sampling signal SVin in divider 66. The quotient can be added to 1 to generate an added signal in adder 67. For example, the added signal is the control signal for controlling the on-time. Then, the control signal can be multiplied by a product of compensation signal Vcamp times proportional coefficient K in multiplier 68. The multiplied control signal product can characterize new on-time $T_{on-new1}$. For example, on-timer 54 times under control of the new on-time $T_{on-new1}$. RS flip-flop 56 can be reset after turn-on timer 54 finishes timing.

$$T_{on-new1} = ((SVin' * Vm)/SVin + 1) * K * Vcamp = \quad (8)$$
$$((SVin + Vm*(SH3*Ratio3 + SH5*Ratio5 + \ldots))/SVin) *$$
$$K*Vcamp$$

In the formula (8), the product of compensation signal Vcamp and K characterizes on-time Ton in the constant on-time mode, $T_{on-new1}$=Ton*(SVin+Vm*(SH3*Ratio3+ SH5*Ratio5+ . . . ))/SVin. According to the setting above, the new on-time is equal to that of the new on-time. By adjusting the on-time, the harmonic component having the same amplitude ratio and opposite phase compared with the predetermined harmonic component can be superimposed on the input current of the switching-type regulator. Therefore, harmonic compensation can be realized and the THD accordingly decreased. Harmonic ratio adjustment circuit 61 can adjust the amplitude ratio of each predetermined harmonic component according to the method of FIG. 4 until the measured THD is no longer decreased. In this way, by adjusting the on-time, the amplitude ratio of each inversely superimposed predetermined harmonic component on input current Iin of the switching-type regulator approaches to an actual amplitude ratio corresponding to the harmonic component in the input current. Thus, harmonic components in the input current of the switching-type regulator can be effectively counteracted such that the total harmonic distortion THD is minimized.

Figure 7:
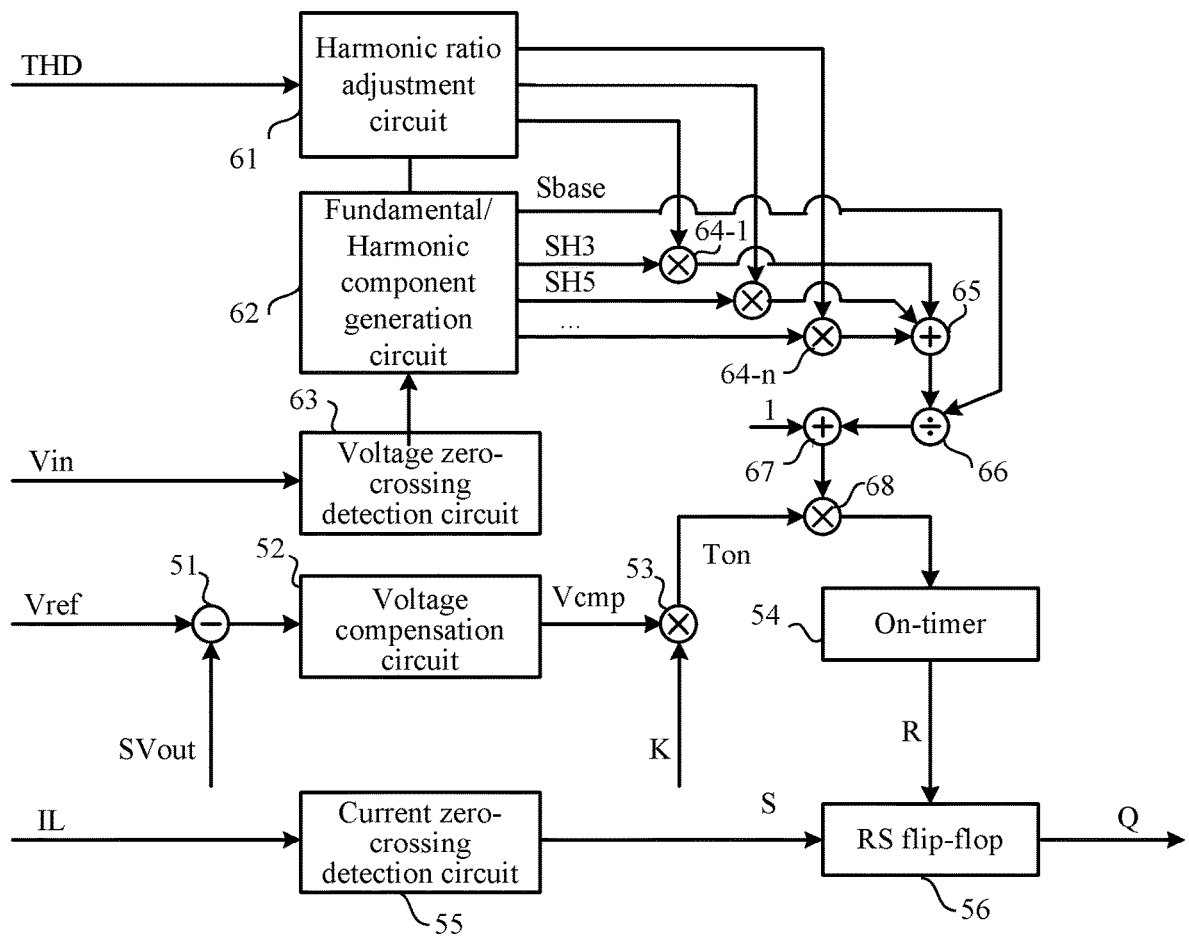
FIG. 7 is a diagram of a second example data flow of the controller adjusting amplitude ratios of harmonic components, in accordance with embodiments of the present invention.

Referring now to FIG. 7, shown is a diagram of a second example data flow of the controller adjusting amplitude ratios of harmonic components, in accordance with embodiments of the present invention. In particular example, the input voltage signal is not sampled, and at least one predetermined harmonic component is inversely superimposed on the control signal for controlling the on-time of the main switch of the switching-type regulator. That is, the on-time is adjusted by using Ton-neat. Here, based on FIG. 5, on-time Ton in the constant on-time mode can be further adjusted to decrease the THD. In addition to subtractor 51, voltage compensation circuit 52, multiplier 53, on-timer 54, current zero-crossing detection circuit 55, and RS flip-flop 56, the controller can also include harmonic ratio adjustment circuit 61, fundamental/harmonic component generation circuit 62, voltage zero-crossing detection unit 63, multipliers 64-1 to 64-*n*, adder 65, divider 66, adder 67, and multiplier 68. Subtractor 51 can acquire the difference between output voltage sampling signal SVout and voltage reference signal Vref, and then output the difference to voltage compensation circuit 52. Further, voltage compensation circuit 52 can output compensation signal Vcmp.

Voltage zero-crossing detection unit 63 can detect a zero-crossing signal of the input voltage and output the zero-crossing signal to fundamental/harmonic component generation circuit 62. The fundamental/harmonic component generation circuit 62 may generate a fundamental component and the predetermined harmonic component, such as third harmonic SH3, and fifth harmonic SH5, based on the zero-crossing signal. Harmonic ratio adjustment circuit 61 can output the amplitude ratio of each predetermined harmonic component based on the measured total harmonic distortion THD, and may adjust the amplitude ratio to minimize the THD. Amplitude ratios output from harmonic ratio adjustment circuit 61 can be multiplied by corresponding predetermined harmonic components in multipliers 64-1 to 64-*n*, respectively, in order to generate at least one voltage harmonic component. All voltage harmonic components can be superimposed in adder 65 to obtain an output parameter SVin', which satisfies the following formula (9).

$$SVin' = SH3*Ratio3 + SH5*Ratio5 + \ldots \quad (9)$$

In the formula above, Ratioi represents an amplitude ratio of an i-th predetermined harmonic component which is generated and adjusted by harmonic ratio adjustment circuit 61. Input signal SVin' can be divided by the fundamental component in divider 66. The quotient may be added to 1 in adder 67 generating the control signal for controlling the on-time. The control signal may be multiplied by a product of compensation signal Vcamp times proportionality coefficient K in multiplier 68. The multiplied control signal product can characterize new on-time $T_{on-new2}$ for controlling the turn-on timer 54 to time. RS flip-flop 56 may be reset after on-timer 54 finishes timing.

$$T_{on-new2} = \quad (10)$$
$$((SH3*Ratio3 + SH5*Ratio5 + \ldots)/Sbase + 1)*K*Vcamp =$$
$$(Sbase + SH3*Ratio3 + SH5*Ratio5 + \ldots)/SVin*K*Vcamp$$

Here in formula (10), the product of compensation signal Vcamp and K characterizes the on-time Ton in the constant on-time mode. Thus, $T_{on-new2}$=Ton*(Sbase+SH3*Ratio3+ SH5*Ratio5+ . . . )/SVin. According to the setting above, the new on-time is equal to that of the new on-time in the above formulas. By adjusting the on-time, the predetermined harmonic component having the same amplitude ratio and opposite phase compared with the harmonic component in the input current of the switching-type regulator can be superimposed on the input current of the switching-type regulator. In this way, harmonic compensation can be realized and the THD decreased.

Harmonic ratio adjustment circuit 61 can adjust the amplitude ratio of each predetermined harmonic component according to the method of FIG. 4 until the measured THD is no longer decreased. By adjusting the on-time, the ratio of each predetermined harmonic component inversely superimposed on input current Iin of the switching-type regulator May approach an actual amplitude ratio corresponding to the harmonic component in the input current. Therefore, the harmonic component in the input current can be reduced and the total harmonic distortion THD minimized. In particular embodiments, the measured total harmonic distortion THD can be used for feedback, such that the THD can be directly adjusted in a closed-loop manner. In such a case, the THD can be reduced without performing compensation, e.g., for a category of factors affecting THD indicators, thereby simplifying the control method. In particular embodiments, the predetermined harmonic component can be inversely superimposed on the control signal for controlling the on-time of the main switch. For example, the amplitude ratio of the predetermined harmonic component may be adjusted to control the on-time of the on-time of the main switch such that the predetermined harmonic component is inversely superimposed on the input current.

It should be understood by those skilled in the art that the parameters and the circuit mentioned above can be modified in certain embodiments. For example, in the first example, signal SVin' after being obtained is multiplied by Vm in multiplier 65. Then, the product is added to input voltage sampling signal SVin. Then, the added signal is divided by SVin. In addition, the other process is substantially the same as that of the first example, so as to obtain new on-time $T_{on-new1}$. Similarly, in the second example, when signal SVin' is obtained, signal SVin' is first added to fundamental component Sbase. The added signal is divided by the fundamental component Sbase. Here, the other process is substantially the same as that of the second example, so as to obtain new on-time Ton-neat. In addition, if the voltage harmonic components generated by the harmonic generation circuit are not inverted, reference symbol 67 is subtractor to achieve the same functionality. In particular embodiments, current zero-crossing detection circuit 55 can perform zero-crossing detection on the inductor current. When the inductor current is detected over zero, RS flip-flop 56 can be set to activate switch control signal Q. Off-time of the main switch of the switching-type regulator can be controlled by zero-crossing detection.

Figure 8:
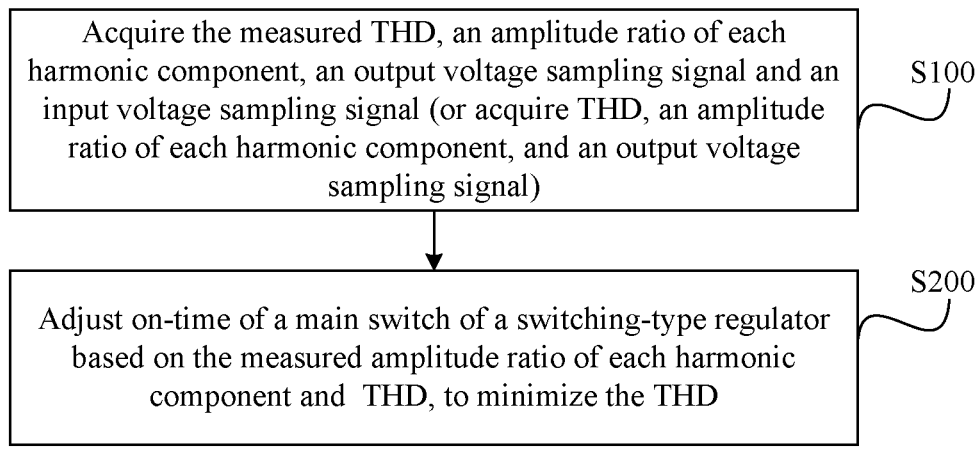
FIG. 8 is a flow diagram of another example control method, in accordance with embodiments of the present invention.

Referring now to FIG. 8, shown is a flow diagram of another example control method, in accordance with embodiments of the present invention. A phase of each predetermined harmonic component can be adjusted based on the measured THD and amplitude ratio Hn of the predetermined harmonic component to minimize the THD. In S100, the measured total harmonic distortion THD, amplitude ratio Hn of each harmonic component, input voltage sampling signal SVin, and output voltage sampling signal SVout can be acquired. Alternatively, the measured total harmonic distortion THD, an amplitude ratio Hn of each harmonic component, and output voltage sampling signal SVout may be acquired. In S200, on-time of the main switch of the switching-type regulator can be adjusted based on the measured amplitude ratio Hn of each predetermined harmonic component and THD, in order to minimize the total harmonic distortion THD. Further, in S200, power factor correction may also be performed in other control loops based on input voltage sampling signal SVin and output voltage sampling signal SVout, or based on output voltage sampling signal SVout. For example, in S200, the total harmonic distortion THD can be minimized by setting an amplitude ratio of each predetermined harmonic component and adjusting a phase of each predetermined harmonic component.

Figure 9:
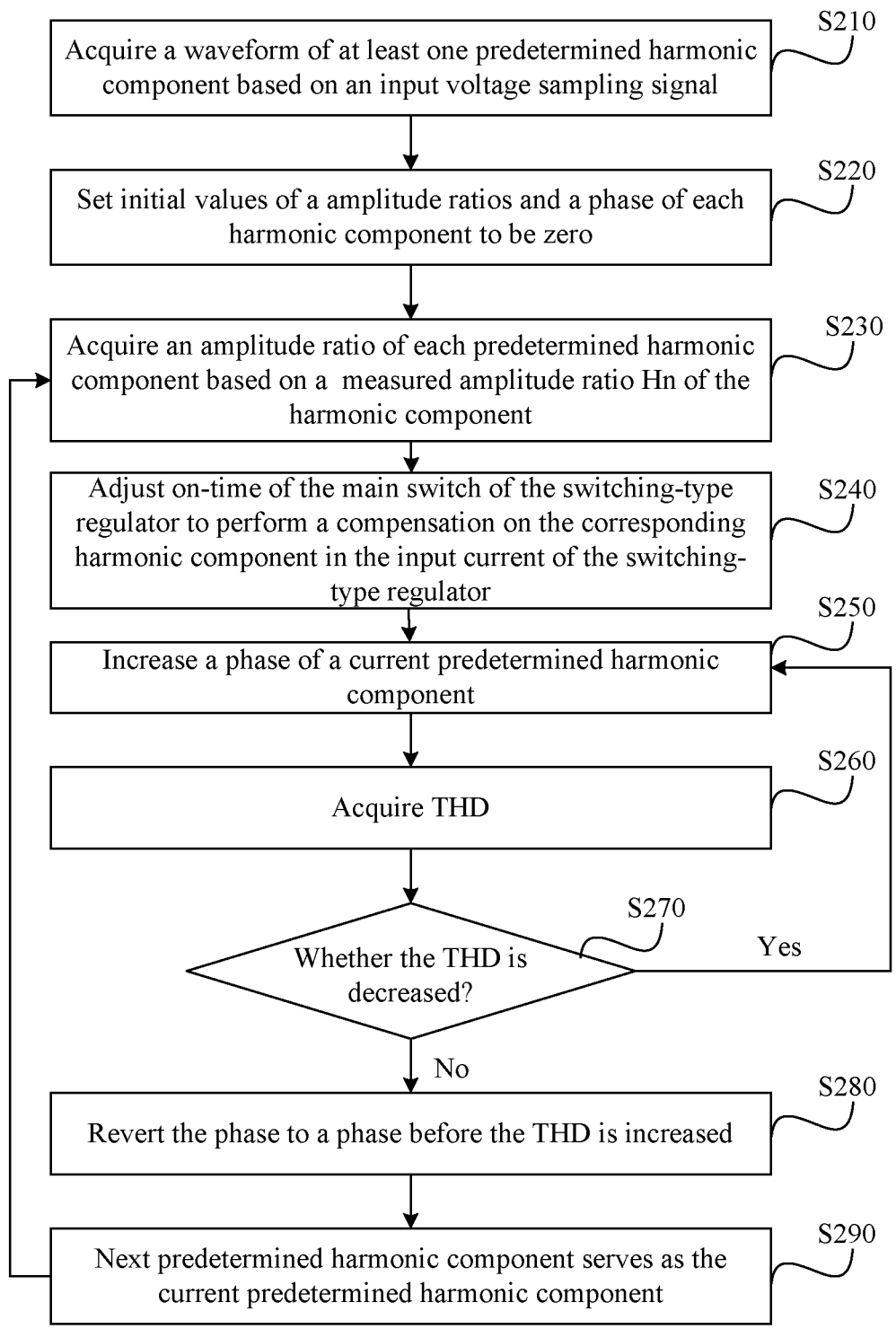
FIG. 9 is a flow diagram of a first example method for adjusting phases of harmonic components, in accordance with embodiments of the present invention.

Referring now to FIG. 9, shown is a flow diagram of a first example method for adjusting phases of harmonic components, in accordance with embodiments of the present invention. As in FIG. 4, the phase of each predetermined harmonic component can be adjusted in a phase increasing manner. In FIG. 9, in S210, at least one predetermined harmonic component may be acquired based on the input voltage sampling signal. Since there may be multiple harmonic components in an input voltage, compensation may generally be performed on only one or more harmonic components with a frequency close to a fundamental frequency. The at least one predetermined harmonic components can be ranked in advance, and an amplitude ratio of each predetermined harmonic component may be set in order based on the measured amplitude ratio Hn of corresponding harmonic components, and a phase of each predetermined harmonic component can be adjusted one-by-one.

In S220, initial values of the amplitude ratio and the phase of each predetermined harmonic component can be set to be zero. In S230, the amplitude ratio of each predetermined harmonic component may be acquired based on the measured amplitude ratio Hn of corresponding harmonic components. In S240, the on-time can be adjusted to perform a compensation on the input current of the switching-type regulator. For example, a predetermined harmonic component can be acquired. Then, the predetermined harmonic component can be multiplied by an amplitude ratio corresponding to the predetermined harmonic component to obtain a multiplied signal, and the multiplied signal may be inversely superimposed on the control signal of the on-time of the main switch of the switching-type regulator.

In S250, the phase of the predetermined harmonic component can be progressively increased. The phase of the predetermined harmonic component may be increased with a predetermined step length, or with changed increased amplitude, which can be calculated for every operation. In S260, the THD may again be measured after adjusting the on-time of the main switch. In S270, whether the THD is reduced after progressively increasing the phase of the predetermined harmonic component can be determined. When the THD is reduced, the process may proceed to S250, in order to progressively increase the phase of the predetermined harmonic component. When the THD has not been reduced, this can indicate that the phase of the predetermined harmonic component before performing the progressive increase operation is opposite to the phase of the harmonic component in the input signal. Then, the process may proceed to S280.

In S280, the phase of the predetermined harmonic component can revert to the phase before the THD was increased. In addition, the predetermined harmonic component having the phase before the THD was increased can be superimposed on the control signal to adjust the on-time according to the formulas above for $T_{on-new1}$ or $T_{on-new2}$. In S290, a next predetermined harmonic component can in turn be used as a current predetermined harmonic component, and the process may return to S230 to adjust the phase of the next predetermined harmonic component. However, when the phase is relatively large, obtaining the phase of the predetermined harmonic component to minimize the THD can be more difficult.

Figure 10:
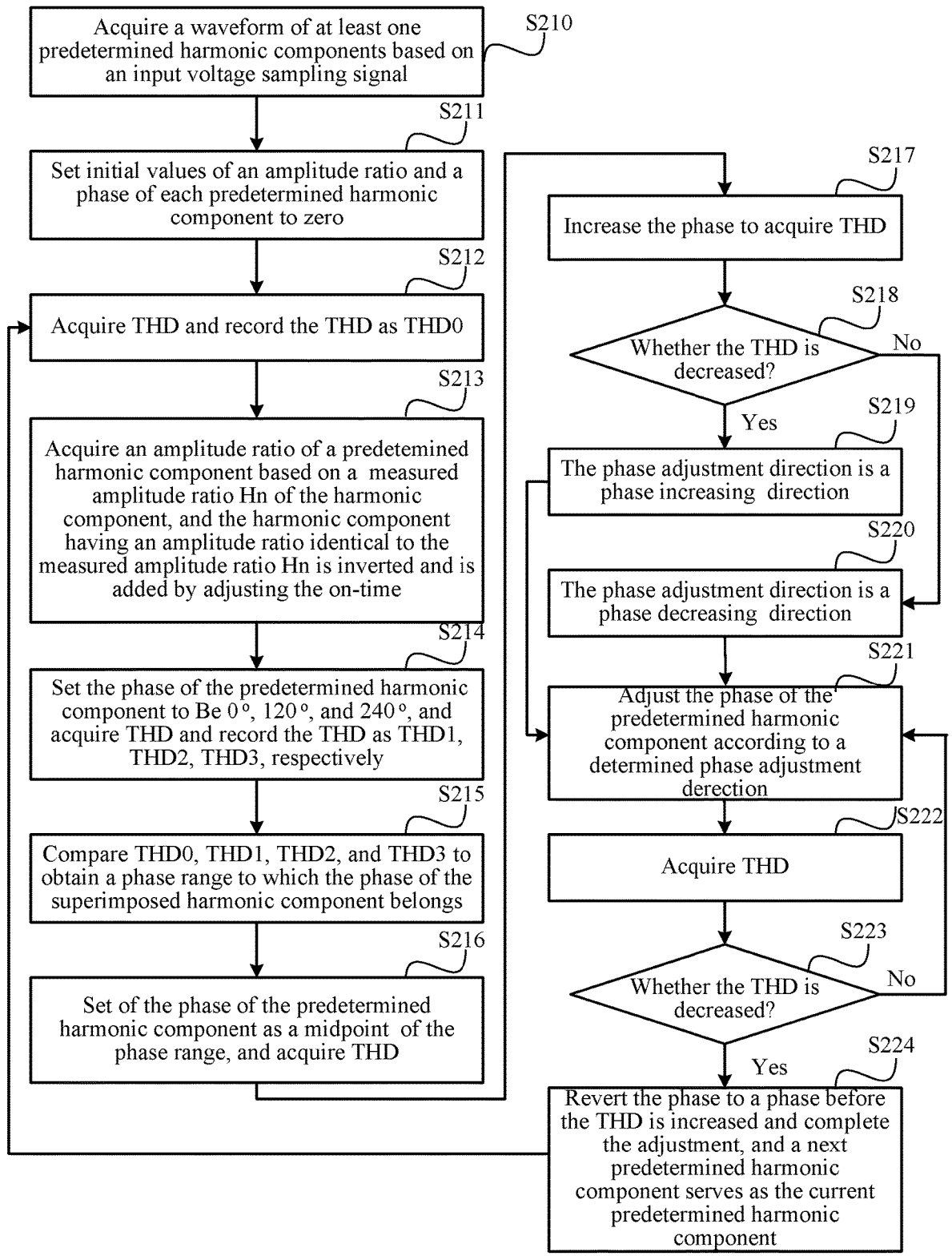
FIG. 10 is a flow diagram of a second example method for adjusting phases of harmonic components, in accordance with embodiments of the present invention.

Referring now to FIG. 10, shown is a flow diagram of a second example method for adjusting phases of harmonic components, in accordance with embodiments of the present invention. In this particular example, a phase of the predetermined harmonic component can be adjusted in a phase partitioned manner which can easily obtain the phase of the predetermined harmonic component to minimize the THD. In S210, at least one predetermined harmonic component may be acquired based on an input voltage sampling signal. Since there may be multiple harmonic components in an input voltage, compensation may generally be performed only on one or more harmonic components with a frequency close to a fundamental frequency. The at least one predetermined harmonic component can be ranked in advance, and an amplitude ratio of each predetermined harmonic component may be set in order based on the measured amplitude ratio Hn of corresponding harmonic components, and a phase of each predetermined harmonic component can be adjusted one-by-one.

In S211, initial values of the amplitude ratio and the phase of each predetermined harmonic component can be set to be zero. In S212, a total harmonic distortion THD may be acquired, which is represented by THD0. In S213, the amplitude ratio of each predetermined harmonic component can be acquired based on the measured amplitude ratio Hn of corresponding harmonic components, and the predetermined harmonic component with the same amplitude ratio compared with the input current of switching-type regulator may be inversely superimposed to the input current of switching-type regulator. For example, a predetermined harmonic component can be acquired. Then, the predetermined harmonic component may be multiplied by an amplitude ratio corresponding to the predetermined harmonic component to obtain a multiplied signal, and the multiplied signal can be inversely superimposed on the control signal of the on-time of the main switch of the switching-type regulator.

In S214, the phase of the predetermined harmonic component can be set to be 0°, 120° and 240° successively, and the total harmonic distortions THD acquired, which are respectively represented by THD1, THD2, and THD3. In S215, magnitudes of the THD0, the THD1, the THD2, and the THD3 can be compared against each other, and a phase range to which the phase of the predetermined harmonic component belongs may be obtained. For example, when the THD1, the THD2, and the THD3 are greater than the THD0, this can indicate that it is unsuitable to perform compensation on a harmonic component of the input signal corresponding to the predetermined harmonic component (e.g., the input signal not includes the harmonic component corresponding to the predetermined harmonic component). Magnitudes of the THD1, the THD2, and the THD3 may be compared against each other, and the phase range to which the phase of the predetermined harmonic component belongs can be obtained.

It should be noted that various partition manners in addition to those exemplified in S214 and S215 are suitable in certain embodiments. In S216, the phase of the superimposed predetermined harmonic component can be set as a midpoint of a phase range and the total harmonic distortion THD acquired again. In S217, the phase can be increased and the total harmonic distortion THD acquired. In S218, whether the total harmonic distortion THD is reduced after increasing the phase can be determined. When the THD is reduced, this can indicate that a phase adjustment direction is a phase-increasing direction and the process may proceed to S219. When the THD as not reduced, this can indicate that a phase adjustment direction is a phase-decreasing direction and the process may proceed to S220.

In S219, the phase adjustment direction is the phase-increasing direction. In S220, the phase adjustment direction is the phase-decreasing direction. In S221, the phase of the predetermined harmonic component can be adjusted continually based on the determined phase adjustment direction. For example, when the phase adjustment direction is the phase-increasing direction, the current phase can be progressively increased. When the phase adjustment direction is the phase-decreasing direction, the current phase can be progressively decreased. In S222, the THD may be acquired.

In S223, it can be determined whether the total harmonic distortion THD has reduced. When the total harmonic distortion THD has reduced, the process may proceed to S221, in order to adjust the phase of the predetermined harmonic component continually according to the determined phase adjustment direction. When the total harmonic distortion THD has not reduced, this may indicate that the phase of the predetermined harmonic component before the progressive increase operation is opposite to the phase of the corresponding harmonic component in the input signal, and therefore the process may proceed to S224.

In S224, the phase can revert to a phase before the THD was increased, and the phase adjustment can be completed. Moreover, the predetermined harmonic component having the phase before the total harmonic distortion was increased can be inversely superimposed on the input current of the switching-type regulator. A next harmonic component can in turn be used as a current predetermined harmonic component, and the process may return to S212, in order to adjust the phase of the next predetermined harmonic component.

As described above, for the predetermined harmonic components, an amplitude ratio of each predetermined harmonic component can be set based on the measured amplitude ratio Hn of corresponding harmonic components, and the phase of each predetermined harmonic component may be adjusted in an one-by-one manner, such that the phase of the predetermined harmonic component is opposite to the phase of a corresponding harmonic component in the input signal, thereby minimizing a THD. It is to be noted that, the adjusting of the phase of each predetermined harmonic component can be maintained during operation of a system, such that the THD of the system is reduced during the whole operation. In another example, a phase for minimizing the THD may also be acquired by continually increasing the phase within a phase range after phase partition.

Figure 11:
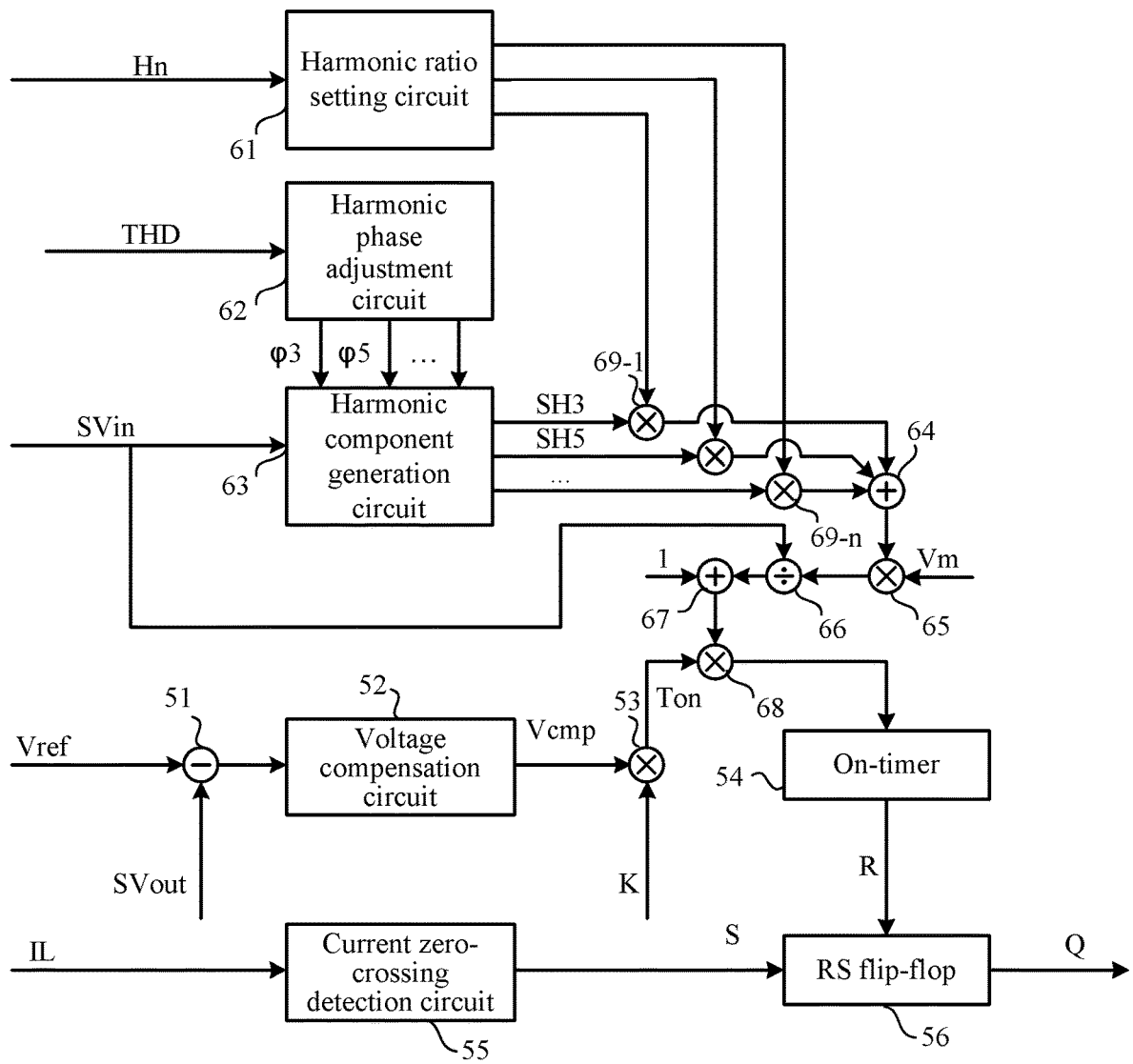
FIG. 11 is a schematic block diagram of a third example data flow of the controller adjusting phases of harmonic components, in accordance with embodiments of the present invention.

Referring now to FIG. 11, shown is a schematic block diagram of a third example data flow of the controller adjusting phases of harmonic components, in accordance with embodiments of the present invention. In this particular example, the input voltage signal can be sampled, and at least one predetermined harmonic component may be inversely superimposed on the control signal for controlling the on-time of the main switch of the switching-type regulator. That is, the on-time can be adjusted by $T_{on\text{-}new1}$. Here, based on the control method in FIG. 5, the on-time Ton in the constant on-time mode can be further adjusted to decrease the THD. In addition to subtractor 51, voltage compensation circuit 52, multiplier 53, on-timer 54, current zero-crossing detection circuit 55, and RS flip-flop 56, the controller can also include harmonic ratio setting circuit 61, harmonic phase adjustment circuit 62, harmonic component generation circuit 63, multipliers 69-1 to 69-n, adder 64, multiplier 65, divider 66, adder 67, and multiplier 68. Subtractor 51 can acquire the difference between output voltage sampling signal SVout and voltage reference signal Vref, and then output the difference to voltage compensation circuit 52. Further, voltage compensation circuit 52 can output compensation signal Vcmp.

Harmonic component generation circuit 63 can generate each predetermined harmonic component based on input voltage sampling signal SVin, such as third harmonic SH3, fifth harmonic SH5, and the like. Harmonic ratio setting circuit 61 can set the amplitude ratio of each predetermined harmonic component based on the measured amplitude ratio Hn corresponding to the harmonic component. Harmonic phase adjustment circuit 62 may output the phase of each predetermined harmonic component based on the measured total harmonic distortion THD, and adjust the phase to minimize the THD. Amplitude ratios output from harmonic ratio setting circuit 61 can be multiplied by corresponding predetermined harmonic components in multipliers 69-1 to 69-n, respectively, in order to generate at least one voltage harmonic component. All voltage harmonic components may be superimposed in adder 64 to obtain an output parameter SVin', which satisfies the following formula (11).

$$SVin'=SH3*Ratio3+SH5*Ratio5+\ldots \quad (11)$$

In the formula above, Shi represents an i-th predetermined harmonic component having a phase. For example, $Shi=\sin(i*wt+\varphi_i)$, and $\varphi_i$ represents the phase of the i-th predetermined harmonic component. Ratioi represents an amplitude ratio of an i-th predetermined harmonic component which is generated and adjusted by harmonic ratio setting circuit 61. Input signal SVin' can be multiplied by amplitude Vm of the fundamental component in the multiplier 65. The product may be divided by input voltage sampling signal SVin in divider 66. The quotient can be added to 1 to generate an added signal in adder 67. The added signal is the control signal for controlling the on-time. Then, the control signal may be multiplied by a product of compensation signal Vcamp times proportional coefficient K in multiplier 68. The multiplied control signal product can characterize new on-time $T_{on-new1}$. For example, on-timer 54 times under control of the new on-time $T_{on-new1}$. RS flip-flop 56 can be reset after turn-on timer 54 finishes timing.

$$T_{on-new1} = ((SVin'*Vm)/SVin+1)*K*Vcamp = \quad (12)$$
$$((SVin+Vm*(SH3*Ratio3+SH5*Ratio5+\ldots))/SVin)*$$
$$K*Vcamp$$

In formula (12), since the product of compensation signal Vcamp and K characterizes on-time Ton in the constant on-time mode, $T_{on-new1}=Ton*(SVin+Vm*(SH3*Ratio3+SH5*Ratio5+\ldots))/SVin$. According to the setting above, the new on-time is equal to that of the new on-time in the above formulas. By adjusting the on-time, the predetermined harmonic component having the same amplitude ratio and opposite phase compared with the harmonic component in the input current of the switching-type regulator can be superimposed on the input current of the switching-type regulator. Therefore, harmonic compensation can be realized and the THD decreased.

Harmonic phase adjustment circuit 62 may adjust the phase of each predetermined harmonic component according the method shown in FIG. 9 or FIG. 10 until the measured THD is no longer decreased. By adjusting the on-time, the phase of each predetermined harmonic component inversely superimposed on input current Iin of the switching-type regulator can be adjusted to be opposite to that of an actual harmonic component in the input current. Thus, harmonic components in the input current of the switching-type regulator can be effectively counteracted such that the total harmonic distortion THD is minimized.

Figure 12:
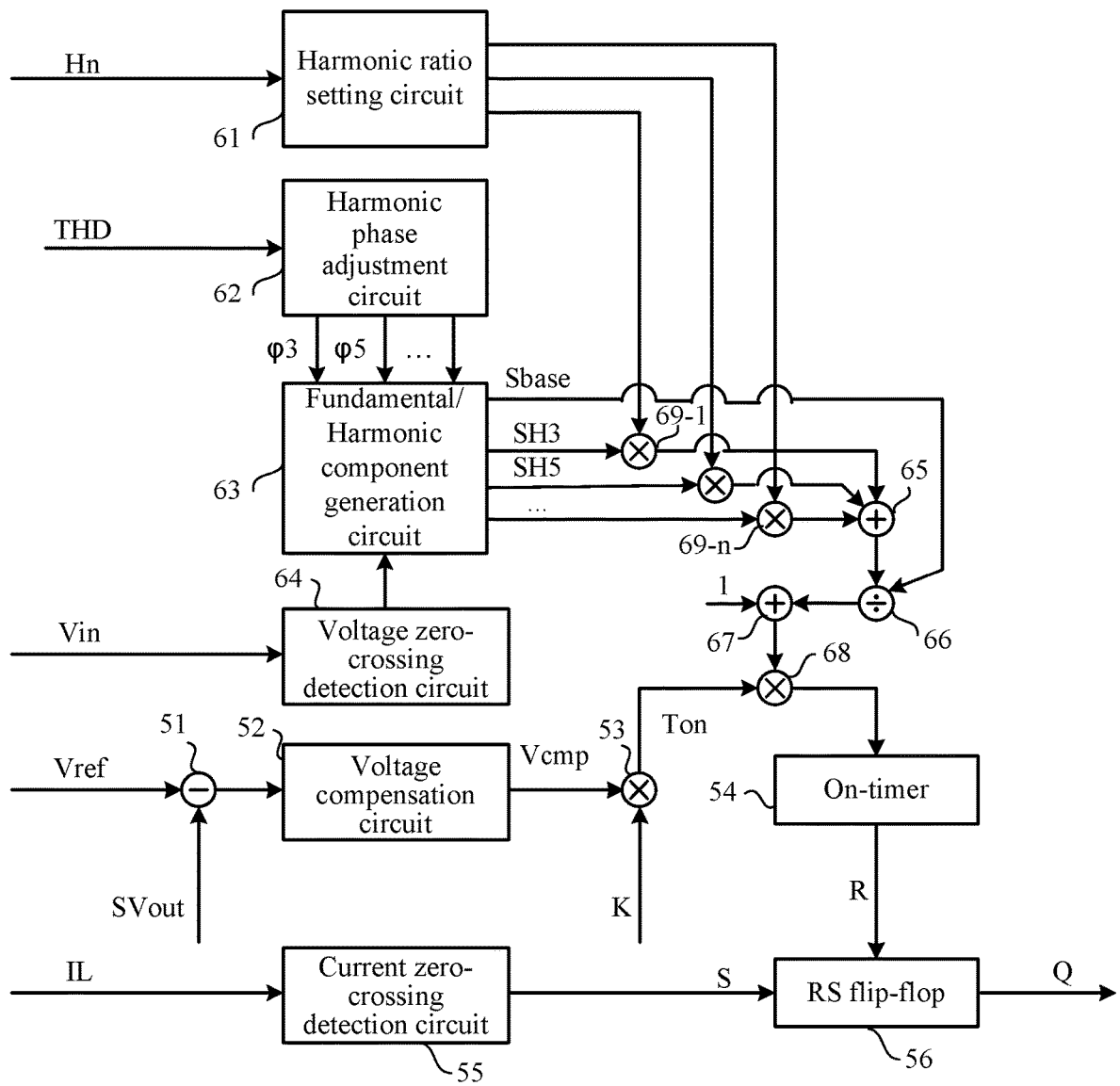
FIG. 12 is a schematic block diagram of a fourth example data flow of the controller adjusting phases of harmonic components, in accordance with embodiments of the present invention.

Referring now to FIG. 12, shown is a schematic block diagram of a fourth example data flow of the controller adjusting phases of harmonic components, in accordance with embodiments of the present invention. In this particular example, the input voltage signal may not be sampled, and at least one predetermined harmonic component can be inversely superimposed on the control signal for controlling the on-time of the main switch of the switching-type regulator. That is, the on-time is adjusted by using Ton-neat. Here, based on the example of FIG. 5, on-time Ton in the constant on-time mode can be further adjusted in order to decrease the THD. In addition to subtractor 51, voltage compensation circuit 52, multiplier 53, on-timer 54, current zero-crossing detection circuit 55, and RS flip-flop 56, the controller can also include harmonic ratio setting circuit 61, harmonic phase adjustment circuit 62, fundamental/harmonic component generation circuit 63, voltage zero-crossing detection unit 64, multipliers 69-1 to 69-n, adder 65, divider 66, adder 67, and multiplier 68. Subtractor 51 can acquire the difference between output voltage sampling signal SVout and voltage reference signal Vref, and then output the difference to voltage compensation circuit 52.

Voltage compensation circuit 52 can output compensation signal Vcmp. Voltage zero-crossing detection unit 64 may detect a zero-crossing signal of the input voltage, and output the zero-crossing signal to fundamental/harmonic component generation circuit 63. The fundamental/harmonic component generation circuit 63 can generate a fundamental component and the predetermined harmonic component, such as third harmonic SH3, and fifth harmonic SH5, based on the zero-crossing signal. Harmonic ratio setting circuit 61 may set the amplitude ratio of each predetermined harmonic component based on the measured amplitude ratio corresponding to the harmonic component in the input current. Harmonic phase adjustment circuit 62 can output the phase of the predetermined harmonic component and adjusts the phase to minimize the THD. Amplitude ratios output from harmonic ratio setting circuit 61 can be multiplied by corresponding predetermined harmonic components in multipliers 69-1 to 69-n respectively to generate at least one voltage harmonic component. All voltage harmonic components may be superimposed in adder 65 to obtain an output parameter SVin', which satisfies the following formula (13).

$$SVin'=SH3*Ratio3+SH5*Ratio5+\ldots \quad (13)$$

In the formula above, Shi represents an i-th predetermined harmonic component having a phase. For example, $Shi=\sin(i*wt+\varphi_i)$, and $\varphi_i$ represents the phase of the i-th predetermined harmonic component. Ratioi represents an amplitude ratio of an i-th predetermined harmonic component which is generated and adjusted by harmonic ratio setting circuit 61. Input signal SVin' can be divided by the fundamental component in divider 66. The quotient can be added to 1 in adder 67 generating the control signal for controlling the on-time. The control signal may be multiplied by a product of compensation signal Vcamp times proportionality coefficient K in multiplier 68. The multiplied control signal product can characterize new on-time $T_{on-new2}$ for controlling the turn-on timer 54 to time. RS flip-flop 56 may be reset after on-timer 54 finishes timing.

$$T_{on-new2} = \quad (14)$$
$$\frac{((SH3*Ratio3+SH5*Ratio5+\ldots)/Sbase+1)*K*Vcamp}{(Sbase+SH3*Ratio3+SH5*Ratio5+\ldots)/SVin*K*Vcamp}$$

Thus per formula (14), $T_{on-new2}$=Ton*(Sbase+ SH3*Ratio3+SH5*Ratio5+ . . . )/SVin. According to the setting above, the new on-time is equal to that of the new on-time in the above formulas. By adjusting the on-time, the predetermined harmonic component having the same amplitude ratio and opposite phase compared with the harmonic component in the input current of the switching-type regulator can be superimposed on the input current of the switching-type regulator. Therefore, the harmonic compensation may be realized and the THD decreased.

Harmonic phase adjustment circuit 62 may adjust the phase of each predetermined harmonic component according the methods shown in FIG. 9 or FIG. 10 until the measured THD is no longer decreased. By adjusting the on-time, the phase of each predetermined harmonic component inversely superimposed on input current Iin of the switching-type regulator can be adjusted to be opposite to that of an actual harmonic component in the input current. Thus, harmonic components in the input current of the switching-type regulator can effectively be counteracted such that the total harmonic distortion THD is minimized.

In particular embodiments, the measured total harmonic distortion THD can be used for feedback, such that the THD can be directly adjusted in a closed-loop manner. In such a case, the THD can be reduced without performing compensation, e.g., for a category of factors affecting THD indicators, thereby simplifying the control method. In particular embodiments, the predetermined harmonic component can be inversely superimposed on the control signal for controlling the on-time of the main switch. For example, the amplitude ratio of the predetermined harmonic component can be adjusted to control the on-time of the main switch such that the predetermined harmonic component is inversely superimposed on the input current.

In other examples, signal SVin' after being obtained can be, multiplied by Vm in multiplier 65. Then the product can be added to input voltage sampling signal SVin. Then, the added signal is divided by SVin. In addition, when signal SVin' is obtained, signal SVin' can be first added to fundamental component Sbase. The added signal may be divided by the fundamental component Sbase. As discussed above, a new on-time $T_{on-new2}$ can be obtained. In addition, if the voltage harmonic components generated by the harmonic generation circuit are not inverted, reference symbol 67 is a subtractor to achieve the same function. It should be understood that any suitable control method as discussed above based on the formulas $T_{on-new1}$ and Ton-neat can be utilized in certain embodiments. In the examples above, current zero-crossing detection circuit 55 can perform zero-crossing detection on the inductor current. When the inductor current is detected over zero, RS flip-flop 56 can be set outputting switch control signal Q. Off-time of the main switch of the switching-type regulator can be controlled by zero-crossing detection.

It should further be understood that the above methods, processes, units, and circuits may be implemented by physical circuits or devices, and/or may be implemented as codes and/or data. The codes and/or data may be stored in a readable storage medium. When a processor reads and executes the above codes and/or data, the processor executes methods and processes that are embodied as data structures and codes and stored in the readable storage medium. The controller described herein may be implemented in various manners. For example, these technologies may be implemented in hardware, firmware, software, or a combination thereof. For hardware implementation, a processing unit for rate control at a receiving station may be implemented in one or more application specific integrated circuits (ASIC), digital signal processors (DSP), digital signal processing devices (DSPD), programmable logic devices (PLD), field programmable gate arrays (FPGA), processors, controllers, microcontrollers, microprocessors, other electronic units for performing the functions described in the present disclosure, or a combination thereof. For firmware or software implementation, rate control may be implemented by circuits (e.g., processes or functions) that perform the functions described in the present disclosure. These software codes may be stored in a memory and executed by a processor. The memory may be implemented inside or outside the processor. When the memory is implemented outside the processor, the memory is communicatively connected to the processor via various suitable ways.

Figure 13:
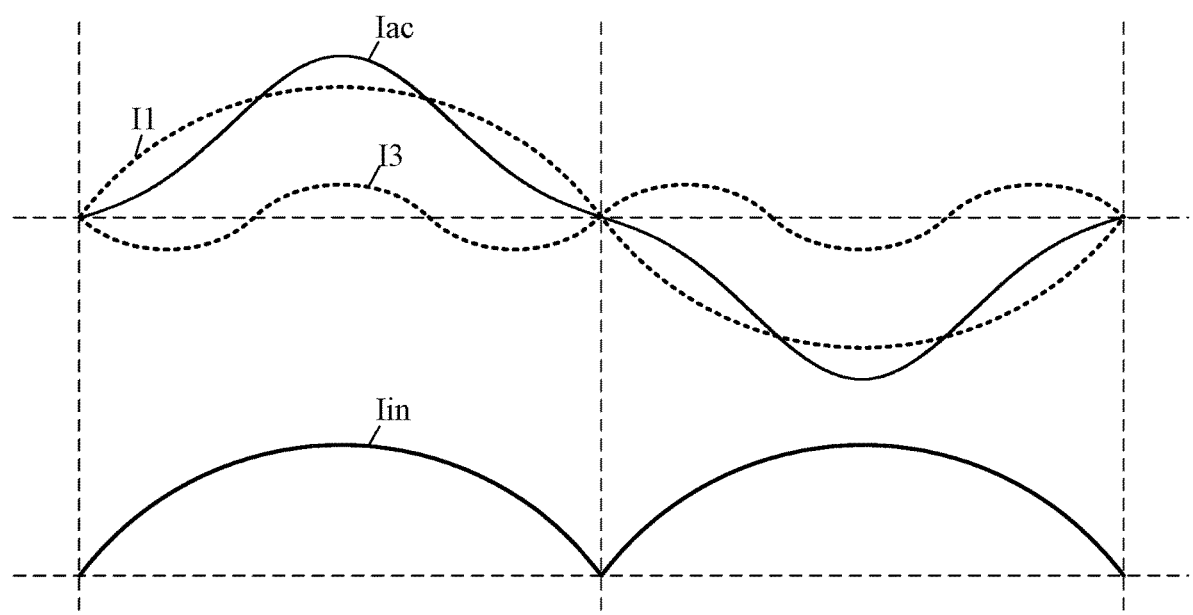
FIG. 13 is a waveform diagram of example operation of an example power factor correction circuit, in accordance with embodiments of the present invention.
Figure 14:
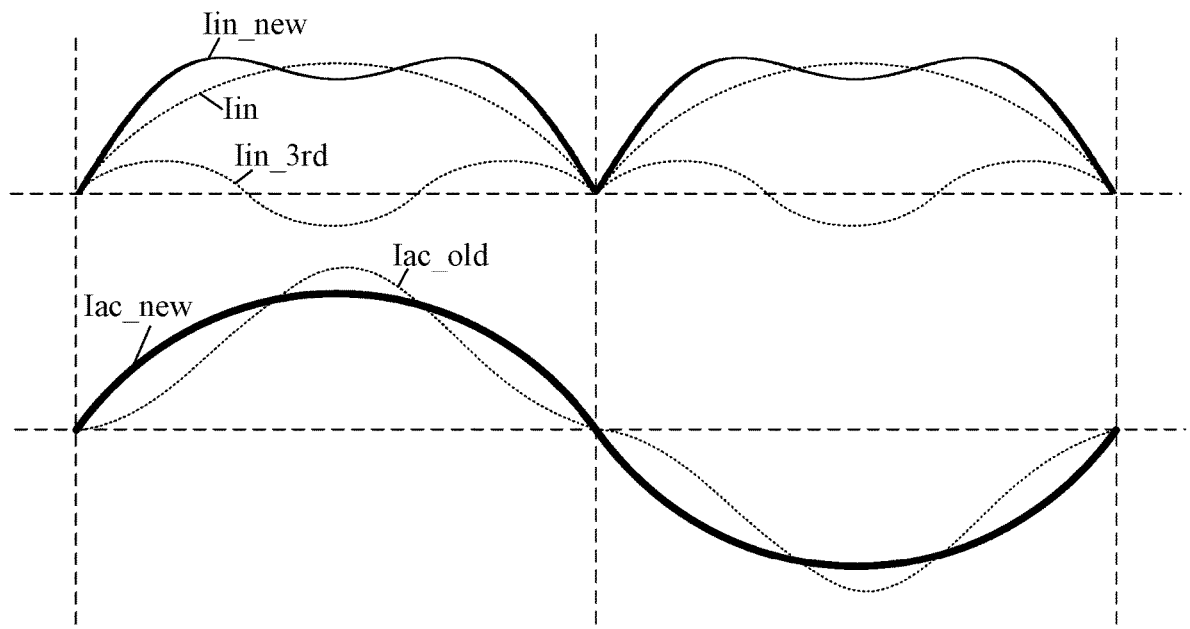
FIG. 14 is a waveform diagram of another example operation of an example power factor correction circuit, in accordance with embodiments of the present invention.

Referring now to FIG. 13, shown is a waveform diagram of example operation of an example power factor correction circuit, in accordance with embodiments of the present invention. Referring also to FIG. 14, shown is a waveform diagram of another example operation of an example power factor correction circuit, in accordance with embodiments of the present invention. In FIG. 13, it is assumed that the THD of input alternating current Iac is 25%, and the harmonic components are all third harmonic components. Here, Iac represents a waveform of the input current of the power factor correction circuit, I1 represents a waveform of a fundamental current, and I3 represents a waveform of the third harmonic component, which follow a relationship of Iac=I1+I3. When the system starts to operate, a sine wave having a phase and a waveform that are identical to that of input voltage Vin of switching-type regulator 22 is used. For example, in the constant on-time mode, under the premise that input current Iin of the switching-type regulator is as shown in FIG. 13, the total harmonic distortion measured by the power meter 1 is equal to 25%.

Controller 3 may acquire a waveform of a third voltage harmonic (that is, a sinusoidal signal with a frequency of 3 multiples of the frequency of the fundamental signal) based on the waveform of the input voltage sampling signal SVin or by performing zero-crossing detection on input voltage Vin. Controller 3 can adjust an amplitude ratio or a phase of the third harmonic component based on the feedback total harmonic distortion THD. A third harmonic component can be inverted and superimposed on the control signal for controlling the on-time of the main switch of the switching-type regulator, to adjust the on-time, so as to invert and superimpose a third harmonic component Iin_3rd on the input current based on the setting until the amplitude ratio or phase minimizes the THD. For example, input current Iin_new after superposition is as shown in the FIG. 14. A comparison between input current Iac_new acquired after the third harmonic can be compensated and input current Iac_old before adjustment is as shown in FIG. 14. It can be seen that the third harmonic in the input current may be counteracted to the greatest extent. When the predetermined harmonic components further include a fifth harmonic, a seventh harmonic and the like, the adjustment may be repeated in order to minimize the total harmonic distortion.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A power factor correction circuit, comprising:
a) a power meter configured to measure a total harmonic distortion (THD) and an amplitude ratio of each harmonic component at an input port;
b) a switching-type regulator that is controllable by a switch control signal in order to adjust a power factor; and
c) a controller configured to generate the switch control signal to control the switching-type regulator to perform power factor correction, to inversely superimpose at least one predetermined harmonic component on a control signal to set the amplitude ratio of each of the predetermined harmonic components based on a measured amplitude ratio of a corresponding harmonic component, and to adjust a phase of each of the predetermined harmonic components based on the measured THD to adjust an on-time of a main switch of the switching-type regulator to minimize the THD.

2. The power factor correction circuit of claim 1, wherein the controller is configured to adjust an amplitude ratio of the predetermined harmonic component based on the measured THD to adjust the on-time of the main switch of the switching-type regulator, in order to minimize the THD.

3. The power factor correction circuit of claim 2, wherein the controller is configured to adjust the amplitude ratio of a predetermined harmonic component one by one by progressively increasing the amplitude ratio from 0 until the measured THD is no longer decreased.

4. The power factor correction circuit of claim 1, wherein the controller is configured to set, based on the measured amplitude ratio of the corresponding harmonic component, the amplitude ratio of the predetermined harmonic component, and to adjust the phase of the predetermined harmonic component in a predetermined order until the measured THD is no longer decreased.

5. The power factor correction circuit of claim 4, wherein the phase of each of the predetermined harmonic components is adjusted to progressively increase from zero until the measured THD is no longer decreased.

6. The power factor correction circuit of claim 4, wherein phase partition is performed, and a phase range where the phase of each of the predetermined harmonic components is located is determined, the phase of each of the predetermined harmonic components is adjusted within the phase range until the measured THD is no longer decreased.

7. The power factor correction circuit of claim 6, wherein a midpoint of the phase range where the phase of each of the harmonic components is located is determined as a reference point, and whether a phase adjustment direction is a phase increasing direction or a phase decreasing direction is determined, and the phase of each of the predetermined harmonic components is adjusted based on the determined phase adjustment direction from the reference point until the measured THD is no longer decreased.

8. The power factor correction circuit of claim 7, wherein the voltage harmonic component is obtained by acquiring a product signal of each predetermined harmonic component and the amplitude ratio corresponding to the predetermined harmonic component and then performing a phase adjustment on the product signal.

9. The power factor correction circuit of claim 7, wherein the voltage harmonic component is a product signal of the predetermined harmonic component and the amplitude ratio corresponding to the predetermined harmonic component.

10. The power factor correction circuit of claim 1, wherein the controller is configured to use k times a product of the control signal and a compensation signal for characterizing the on-time of the main switch of the switching-type regulator, and the compensation signal is a difference between a voltage reference signal and an output voltage.

11. The power factor correction circuit of claim 1, wherein each of the at least one predetermined harmonic component is adjacent to a fundamental component.

12. A method of controlling a switching-type regulator configured to perform power factor correction, the method comprising:
a) measuring a total harmonic distortion (THD) and an amplitude ratio of each harmonic component at an input port; and
b) adjusting superimposing inversely, by a controller, at least one predetermined harmonic component on a control signal;
c) setting, by the controller, the amplitude ratio of each of the at least one predetermined harmonic component based on a measured amplitude ratio of a corresponding harmonic component; and
d) adjusting, by the controller, a phase of each of the at least one predetermined harmonic component based on the measured total harmonic distortion to adjust the on-time of the main switch of the switching-type regulator, in order to minimize the THD.

13. The method of claim 12, further comprising adjusting an amplitude ratio of the predetermined harmonic component based on the measured total harmonic distortion to adjust the on- time of the main switch of the switching-type regulator, to minimize the THD.

14. The method of claim 13, further comprising:
a) sampling an input voltage of the switching-type regulator to obtain an input voltage sampling signal;
b) adjusting the on-time of the main switch of the switching-type regulator based on the control signal; and
c) wherein the control signal is a quotient of a first signal divided by the input voltage sampling signal, the first signal is a sum of the input voltage sampling signal and a second signal, the second signal is a product of an amplitude of a fundamental component and a value of a voltage harmonic component corresponding to the predetermined harmonic component superimposed inversely, each voltage harmonic component has the same amplitude ratio with a corresponding harmonic component in the input signal, and the predetermined harmonic component acquired based on the input voltage sampling signal.

15. The method of claim 13, further comprising:
a) sampling an input voltage of the switching-type regulator to obtain an input voltage sampling signal;
b) adjusting the on-time of the main switch of the switching-type regulator based on the control signal; and
c) wherein the control signal is one plus a quotient of a second signal divided by the input voltage sampling signal, the second signal is a product of an amplitude of a fundamental component and a value of the voltage harmonic component corresponding to the predetermined harmonic component superimposed inversely, each voltage harmonic component has the same amplitude ratio with a corresponding harmonic component in the input signal, and the predetermined harmonic component acquired based on the input voltage sampling signal.

16. The method of claim 12, further comprising:
a) setting, based on the measured amplitude ratio of a corresponding harmonic component, the amplitude ratio of one of the at least one predetermined harmonic component; and
b) adjusting the phase of the one of the at least one predetermined harmonic component in a predetermined order until the measured THD is no longer decreased.

\* \* \* \* \*